United States Patent
Sekiya

(10) Patent No.: US 10,854,462 B2
(45) Date of Patent: Dec. 1, 2020

(54) WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 391 days.

(21) Appl. No.: 15/987,051

(22) Filed: May 23, 2018

(65) Prior Publication Data

US 2018/0342398 A1 Nov. 29, 2018

(30) Foreign Application Priority Data

May 25, 2017 (JP) .................................. 2017-103502

(51) Int. Cl.
*B24B 9/06* (2006.01)
*H01L 21/304* (2006.01)
*H01L 21/683* (2006.01)
*H01L 21/78* (2006.01)

(52) U.S. Cl.
CPC .......... *H01L 21/3043* (2013.01); *B24B 9/065* (2013.01); *H01L 21/6836* (2013.01); *H01L 21/78* (2013.01); *H01L 2221/6834* (2013.01); *H01L 2221/68327* (2013.01)

(58) Field of Classification Search
CPC . B24B 9/065; H01L 21/3043; H01L 21/6836; H01L 21/78; H01L 2221/68327; H01L 2221/6834
USPC .......................................................... 451/44
See application file for complete search history.

(56) References Cited

U.S. PATENT DOCUMENTS

| 4,391,658 | A | * | 7/1983 | Kitane | H01L 21/2252 257/E21.146 |
|---|---|---|---|---|---|
| 4,407,262 | A | * | 10/1983 | Wirz | B23D 59/008 125/13.01 |
| 4,761,335 | A | * | 8/1988 | Aurichio | H01L 23/556 428/352 |
| 4,775,438 | A | * | 10/1988 | Funakoshi | B29C 63/0013 156/230 |
| 2008/0057834 | A1 | * | 3/2008 | Kroeninger | B24B 41/068 451/44 |
| 2009/0042368 | A1 | * | 2/2009 | Sekiya | H01L 21/3065 438/460 |
| 2017/0025275 | A1 | * | 1/2017 | Hirata | B23K 26/032 |
| 2017/0301549 | A1 | * | 10/2017 | Suzuki | B24B 27/06 |

FOREIGN PATENT DOCUMENTS

JP 10050642 A 2/1998

* cited by examiner

*Primary Examiner* — George B Nguyen
(74) *Attorney, Agent, or Firm* — Greer Burns & Crain Ltd.

(57) ABSTRACT

A wafer processing method for processing a wafer includes an annular groove forming step, a close contact making step, a protective member fixing step, a grinding step, and a peeling step. The wafer has a device area and a peripheral marginal area surrounding the device area on the front side, and devices each having asperities are formed in the device area. In the annular groove forming step, an annular groove is formed on the front side of the wafer along the inner circumference of the peripheral marginal area. In the close contact making step, the device area and the annular groove are covered with a protective film, and the protective film is bring into close contact with the front side of the wafer.

10 Claims, 11 Drawing Sheets

WAFER PROCESSING METHOD

BACKGROUND OF THE INVENTION

Field of the Invention

The present invention relates to a wafer processing method for use in grinding a wafer having asperities formed on the front side.

Description of the Related Art

There is an increasing chance of thinning a wafer before dividing the wafer into device chips, so as to reduce the size and weight of each device chip adapted to be incorporated into various electronic equipment or the like. For example, the wafer can be thinned by holding the front side of the wafer on which devices are formed on a chuck table, rotating a grinding wheel, and pressing the grinding wheel against the back side of the wafer to thereby grind the back side of the wafer.

In grinding the wafer by using the above method, a protective member is usually attached to the front side of the wafer (see Japanese Patent Laid-Open No. Hei 10-50642, for example). The protective member can prevent the possibility that the devices formed on the front side of the wafer may be damaged by a force applied to the wafer in grinding the wafer. Examples of the protective member include an adhesive tape formed of resin and a substrate having high hardness.

SUMMARY OF THE INVENTION

In many cases, asperities such as bumps functioning as electrodes on each device are formed on the front side of the wafer. However, when such asperities are present on the front side of the wafer, there arises a problem such that a height difference due to the asperities cannot be sufficiently absorbed by an adhesive tape and the shape corresponding to each asperity may appear on the back side of the wafer after grinding.

By using a substrate having high hardness as the protective member, the above problem can be almost eliminated. However, this substrate is bonded to the wafer by using an adhesive such as a thermoplastic wax. Accordingly, in peeling the substrate from the wafer after grinding, it is necessary to conduct any extensive work dedicated to peeling, such as immersion of the wafer in a solution or heating of the wafer at high temperatures.

It is therefore an object of the present invention to provide a wafer processing method which can sufficiently suppress the influence of the asperities present on the front side of the wafer in grinding the back side of the wafer and can simply perform a peeling operation after grinding.

In accordance with an aspect of the present invention, there is provided a wafer processing method for processing a wafer having a central device area and a peripheral marginal area surrounding the device area on the front side, a plurality of devices each having asperities being formed in the device area, the wafer processing method including an annular groove forming step of forming an annular groove on the front side of the wafer along the inner circumference of the peripheral marginal area, the annular groove having a depth greater than a finished thickness of the wafer; a close contact making step of covering the device area and the annular groove on the front side of the wafer with a protective film after performing the annular groove forming step, and next bringing the protective film into close contact with the front side of the wafer so as to follow the asperities of each device formed on the front side of the wafer; a protective member fixing step of covering the protective film and an exposed part of the peripheral marginal area with a protective member formed from a liquid resin curable by external stimulus after performing the close contact making step, thereby fixing the protective member through the protective film to the front side of the wafer; a grinding step of holding the protective member fixed to the wafer on a holding surface of a chuck table in the condition where the back side of the wafer is exposed after performing the protective member fixing step, and next grinding the back side of the wafer to thereby reduce the thickness of the wafer to the finished thickness of the wafer, so that the bottom of the annular groove is exposed to the back side of the wafer, thereby separating the wafer along the annular groove into an annular portion including the peripheral marginal area and a circular portion including the device area in the condition where the protective member is fixed to the wafer; and a peeling step of peeling the protective member and the protective film from the device area of the circular portion and removing the protective member and the protective film together with the annular portion.

Preferably, the close contact making step includes the step of forcing the protective film into the annular groove to thereby bring the protective film into close contact with the inside surface of the annular groove.

Preferably, the annular groove forming step includes the step of cutting the front side of the wafer along the inner circumference of the peripheral marginal area by using a cutting blade, thereby forming the annular groove.

Preferably, the annular groove forming step includes the step of applying a laser beam to the front side of the wafer along the inner circumference of the peripheral marginal area, the laser beam having an absorption wavelength to the wafer, thereby forming the annular groove.

Preferably, the outer circumference of the wafer is chamfered on the front side of the wafer; the protective member fixing step including the step of fully covering the front side of the wafer with the protective member in such a manner that a chamfered portion of the outer circumference of the wafer is also covered with the protective member.

Preferably, the protective member fixing step includes the steps of applying the liquid resin to a flat sheet, next pressing the wafer against the liquid resin through the protective film to thereby fully cover the protective film with the liquid resin, and next applying the external stimulus to the liquid resin to thereby cure the liquid resin, thereby forming the protective member from the liquid resin and fixing the protective member to the wafer.

Preferably, the close contact making step includes the steps of pressing the protective film against the front side of the wafer under vacuum and next applying atmospheric pressure to the protective film to thereby bring the protective film into close contact with the front side of the wafer so as to follow the asperities.

Preferably, the close contact making step includes the steps of opposing the protective film to the front side of the wafer and next pressing the protective film against the front side of the wafer in a radially outward direction starting from the center of the wafer to thereby bring the protective film into close contact with the front side of the wafer so as to follow the asperities.

Preferably, the close contact making step includes the steps of supplying a liquid to the front side of the wafer and next pressing the protective film against the front side of the wafer with the liquid interposed therebetween.

Preferably, in this case, the peeling step includes the step of heating the liquid left between the protective film and the front side of the wafer to thereby vaporize the liquid.

In the wafer processing method according to the present invention, the device area where the devices each having the asperities are formed is first covered with the protective film, and the protective film is then brought into close contact with the device area so as to follow the asperities. Thereafter, the protective film and an exposed part of the peripheral marginal area are covered with the protective member formed from the liquid resin curable by external stimulus, thereby fixing the protective member through the protective film to the front side of the wafer. Accordingly, by forming the protective member having a suitable thickness, the asperities formed on the front side of the wafer can be sufficiently absorbed.

In the wafer processing method according to the present invention, the protective film is not bonded to the device area of the wafer, but is merely in close contact with the device area. Accordingly, the protective member and the protective film can be simply peeled from the device area without the need for any extensive work dedicated to peeling, such as immersion of the wafer in a solution or heating of the wafer at high temperatures. Further, since no adhesive is left in the device area, it is unnecessary to perform any operation for removing the adhesive. Thus, according to the present invention, it is possible to provide a wafer processing method which can exhibit the effects that the influence of the asperities present on the front side of the wafer can be sufficiently suppressed in grinding the back side of the wafer and that the peeling operation after grinding can also be simply performed.

Further, in the wafer processing method according to the present invention, an exposed part of the peripheral marginal area is covered with the protective member formed from the liquid resin curable by external stimulus. Accordingly, the protective member adheres directly to the wafer in the peripheral marginal area, that is, the protective member is bonded to the peripheral marginal area of the wafer. As a result, although the protective film does not have adhesion by an adhesive (paste), there is no possibility that the protective film and the protective member may be peeled from the wafer in grinding the wafer.

Furthermore, in the wafer processing method according to the present invention, the annular groove having a depth greater than the finished thickness of the wafer is first formed on the front side of the wafer along the inner circumference of the peripheral marginal area. Thereafter, the back side of the wafer is ground to thin the wafer to the finished thickness. Accordingly, by grinding the wafer, the wafer is separated along the annular groove into the circular portion including the device area and the annular portion including the peripheral marginal area. Accordingly, it is unnecessary to peel the protective member from the annular portion in the peeling step. That is, only by moving the annular portion away from the circular portion in the peeling step, the protective member and the protective film can be peeled from the device area of the circular portion.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 11 is a schematic sectional side view showing a manner of forming an annular groove on the front side of the wafer in an annular groove forming step in a wafer processing method according to a fourth modification.

DETAILED DESCRIPTION OF THE PREFERRED EMBODIMENT

A preferred embodiment of the present invention will now be described with reference to the attached drawings. The wafer processing method according to this preferred embodiment includes an annular groove forming step (see FIG. 1B), a close contact making step (see FIGS. 2A, 2B, 3A, 3B, and 3C), a protective member fixing step (see FIGS. 4A, 4B, and 4C), a grinding step (see FIGS. 5A and 5B), and a peeling step (see FIG. 6). In the annular groove forming step, an annular groove is formed on the front side of a wafer along the inner circumference of a peripheral marginal area surrounding a device area formed on the front side of the wafer, the annular groove having a depth greater than a finished thickness of the wafer. In the close contact making step, a protective film not having adhesion by an adhesive (paste) is brought into close contact with the front side of the wafer so as to follow asperities present in the device area of the wafer.

In the protective member fixing step, the protective film and a part of the peripheral marginal area of the wafer are covered with a protective member formed from a liquid resin to thereby fix the protective member through the protective film to the front side of the wafer. In the grinding step, the back side of the wafer is ground in the condition where the protective member fixed through the protective film to the front side of the wafer is held on a holding surface of a chuck table, thereby reducing the thickness of the wafer to the finished thickness. As the result of this grinding step, the wafer is separated into an annular portion including the peripheral marginal area and a circular portion including the device area. In the peeling step, the protective member and the protective film are peeled together from the device area of the circular portion and removed together with the annular portion. The wafer processing method according to this preferred embodiment will now be described in more detail.

Figure 1A:
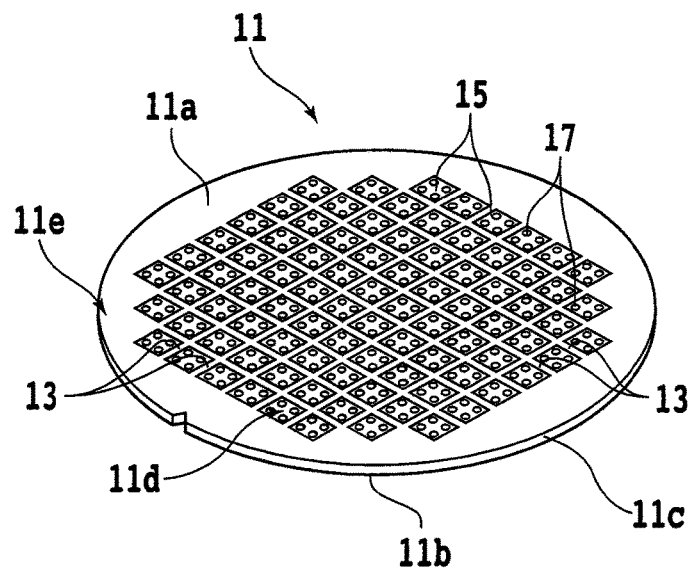
FIG. 1A is a schematic perspective view showing the configuration of a wafer.

FIG. 1A is a schematic perspective view showing the configuration of a wafer 11 to be used in the wafer processing method according to this preferred embodiment. As shown in FIG. 1A, the wafer 11 is a disk-shaped wafer formed of silicon (Si), for example. The wafer 11 has a front side 11a, a back side 11b, and an outer circumference 11c. The outer circumference 11c of the wafer 11 is chamfered along the opposite edges both on the front side 11a and on the back side 11b. The front side 11a of the wafer 11 is composed of a central device area 11d and a peripheral marginal area 11e surrounding the device area 11d. The device area 11d is partitioned by a plurality of crossing division lines (streets) 13 to thereby define a plurality of separate regions where a plurality of devices 15 such as integrated circuits (ICs) are respectively formed. Further, a plurality of bumps (asperities) 17 functioning as electrodes are provided on the front side of each device 15. Each bump 17 is formed of solder, for example. While the wafer 11 is a disk-shaped wafer formed of silicon, for example, in this preferred embodiment, the wafer 11 is not limited in material, shape, structure, size, etc. That is, the wafer 11 may be a wafer formed of any other semiconductors, ceramic, resin, metal, etc. Similarly, the devices 15 and the bumps 17 are not limited in kind, number, shape, structure, size, layout, etc. The bumps 17 may be replaced by any structures (asperities) having any other functions. That is, the bumps 17 may not be formed on the front side 11a of the wafer 11, but any other asperities may be formed on the front side 11a of the wafer 11.

Figure 1B:
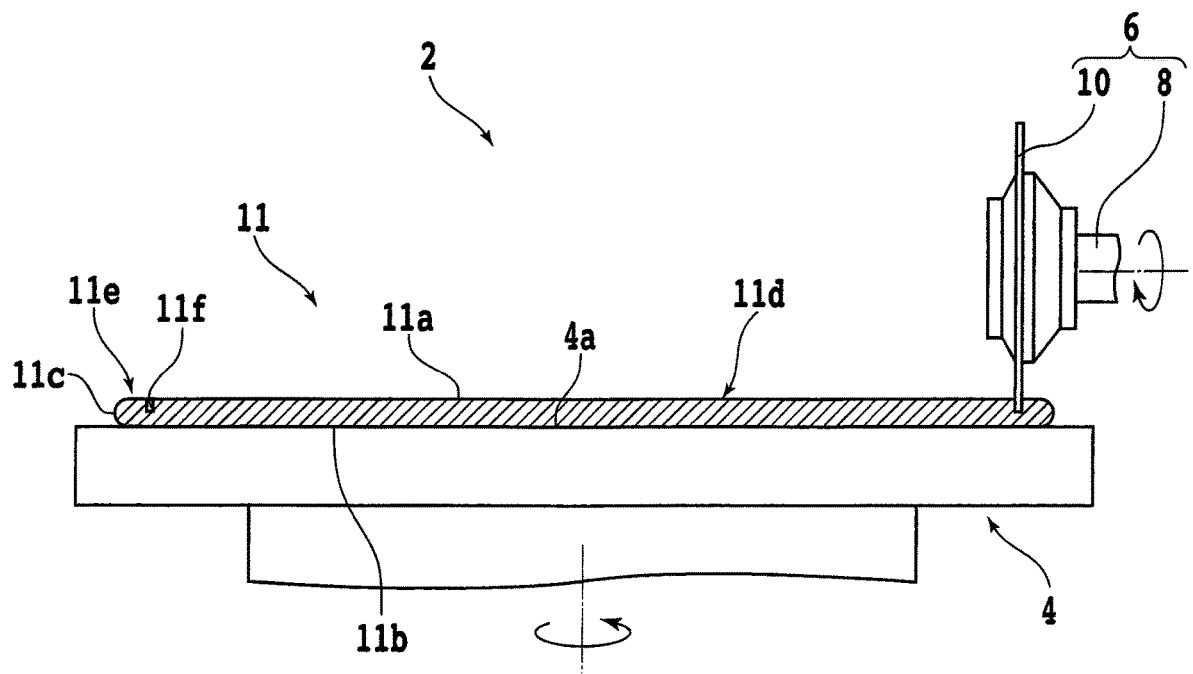
FIG. 1B is a schematic sectional side view showing a manner of forming an annular groove on the front side of the wafer in an annular groove forming step in a wafer processing method according to a preferred embodiment of the present invention.

In this preferred embodiment, the annular groove forming step is first performed to form an annular groove on the front side 11a of the wafer 11, and the annular groove has a depth greater than a finished thickness of the wafer 11. FIG. 1B is a schematic sectional side view showing a manner of forming the annular groove on the front side 11a of the wafer 11. The annular groove forming step may be performed by using a cutting apparatus 2 shown in FIG. 1B. The cutting apparatus 2 includes a chuck table (holding table) 4 for holding the wafer 11 under suction. The chuck table 4 is connected to a rotational drive source (not shown) such as a motor. Accordingly, the chuck table 4 is adapted to be rotated about its axis substantially parallel to a vertical direction, by operating this rotational drive source. Further, a work feeding mechanism (not shown) is provided below the chuck table 4, so as to move the chuck table 4 in a work feeding direction (first horizontal direction).

The chuck table 4 has an upper surface, a part of which is formed as a holding surface 4a for holding the back side 11b of the wafer 11 under suction. The holding surface 4a is connected through a suction passage (not shown) to a vacuum source (not shown), and the suction passage is formed inside the chuck table 4. Accordingly, by applying a vacuum generated from the vacuum source through the suction passage to the holding surface 4a in the condition where the back side 11b of the wafer 11 is in contact with the holding surface 4a, the wafer 11 can be held on the chuck table 4 under suction. As a modification, the chuck table 4 may be replaced by another type of chuck table capable of holding the wafer 11 by using a mechanical method or an electrical method. A cutting unit 6 for cutting the wafer 11 is provided above the chuck table 4. The cutting unit 6 includes a spindle 8 having a rotation axis substantially perpendicular to the work feeding direction in a horizontal plane. An annular cutting blade 10 is mounted on the spindle 8 at one end thereof. A rotational drive source (not shown) such as a motor is connected to the other end of the spindle 8. Accordingly, the cutting blade 10 mounted on the spindle 8 is adapted to be rotated by a force transmitted from the rotational drive source. The cutting unit 6 is supported to an elevating mechanism (not shown) and an indexing mechanism (not shown). The elevating mechanism functions to vertically move the cutting unit 6 in a cutter feeding direction (vertical direction), and the indexing mechanism functions to move (index) the cutting unit 6 in an indexing direction (second horizontal direction) substantially perpendicular to the work feeding direction in a horizontal plane.

In the annular groove forming step, the wafer 11 is first placed on the chuck table 4 in the condition where the back side 11b of the wafer 11 is in contact with the holding surface 4a of the chuck table 4. At this time, the center of the wafer 11 is made to substantially coincide with the rotation axis of the chuck table 4 as viewed in plan. Thereafter, a vacuum generated from the vacuum source is applied to the wafer 11 held on the holding surface 4a of the chuck table 4. Accordingly, the wafer 11 is held on the chuck table 4 under suction in the condition where the front side 11a of the wafer 11 is exposed upward. Thereafter, the cutting blade 10 is rotated to cut the front side 11a of the wafer 11 along the inner circumference of the peripheral marginal area 11e, that is, along the annular boundary between the device area 11d and the peripheral marginal area 11e. More specifically, as shown in FIG. 1B, the cutting blade 10 being rotated is lowered to cut the inner circumference of the peripheral marginal area 11e formed on the front side 11a of the wafer 11. At the same time, the chuck table 4 is rotated. The height of the lower end of the cutting blade 10 in cutting the front side 11a of the wafer 11 is adjusted so as to correspond to a depth greater than the finished thickness of the wafer 11, from the front side 11a of the wafer 11. As a result, an annular groove 11f having a depth greater than the finished thickness of the wafer 11 is formed on the front side 11a of the wafer 11 along the inner circumference of the peripheral marginal area 11e.

Figure 2A:
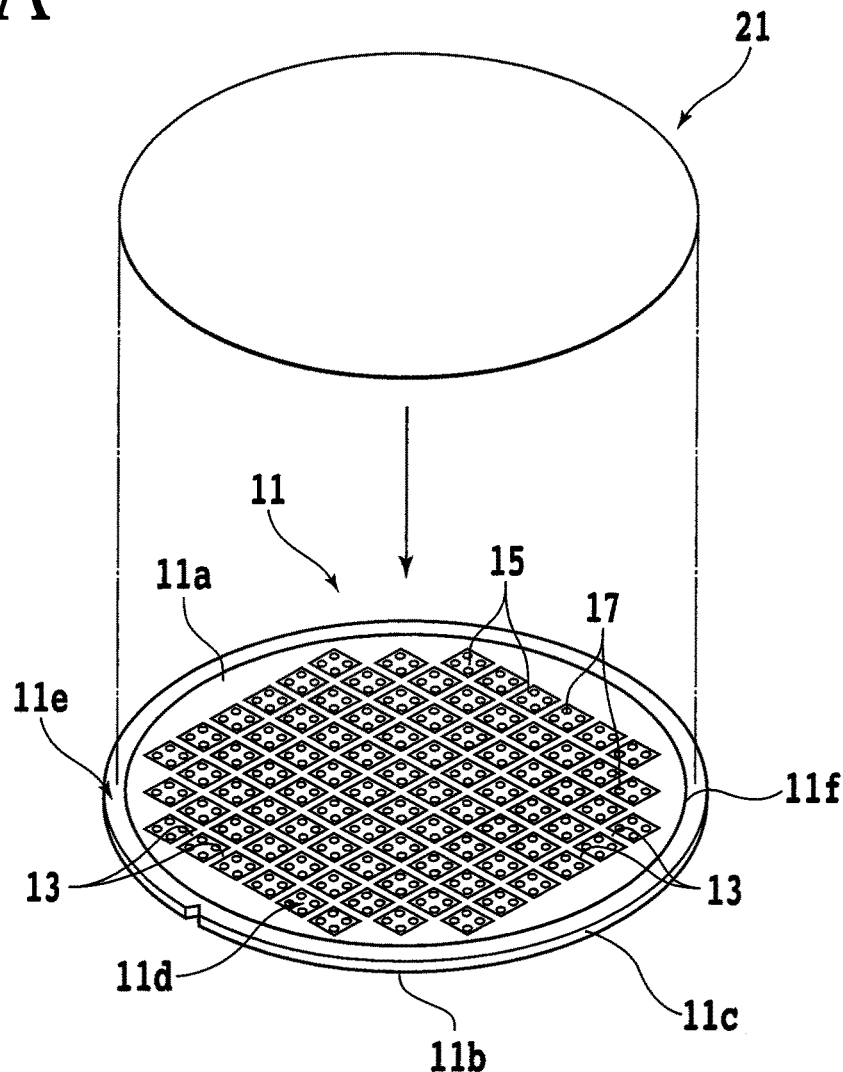
FIG. 2A is a schematic perspective view showing a manner of covering the front side of the wafer with a protective film in a close contact making step in the wafer processing method according to this preferred embodiment.
Figure 2B:
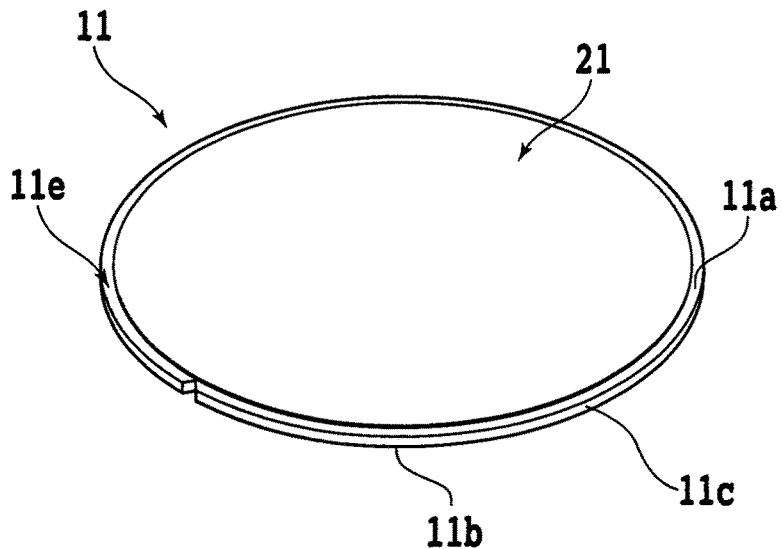
FIG. 2B is a schematic perspective view showing a condition where the front side of the wafer is covered with the protective film in the close contact making step.

After performing the annular groove forming step, the close contact making step is performed to bring a protective film not having adhesion by an adhesive into close contact with the front side 11a of the wafer 11 so as to follow the asperities formed on the front side 11a of the wafer 11. More specifically, the front side 11a of the wafer 11 is first covered with a protective film having no adhesive, and this protective film is next brought into close contact with the front side 11a of the wafer 11. FIG. 2A is a schematic perspective view showing a manner of covering the front side 11a of the wafer 11 with a protective film 21, and FIG. 2B is a schematic perspective view showing a condition where the front side 11a of the wafer 21 is covered with the protective film 21. As shown in FIGS. 2A and 2B, the protective film 21 is a flexible film formed of resin, for example. The protective film 21 is a circular member having a diameter larger than the outer diameter of the annular groove 11f and smaller than the diameter of the wafer 11. Further, the protective film 21 is not provided with an adhesive. The thickness of the protective film 21 is not especially limited. For example, the thickness of the protective film 21 may be set to approximately 30 μm to 150 μm.

In the close contact making step, the device area 11d of the wafer 11 is first covered with the protective film 21. More specifically, as shown in FIG. 2A, the protective film 21 is superimposed on the front side 11a of the wafer 11 so as to fully cover the annular groove 11f formed along the inner circumference of the peripheral marginal area 11e. In this condition, a part of the peripheral marginal area 11e of the wafer 11 is exposed as shown in FIG. 2B.

Figure 3A:
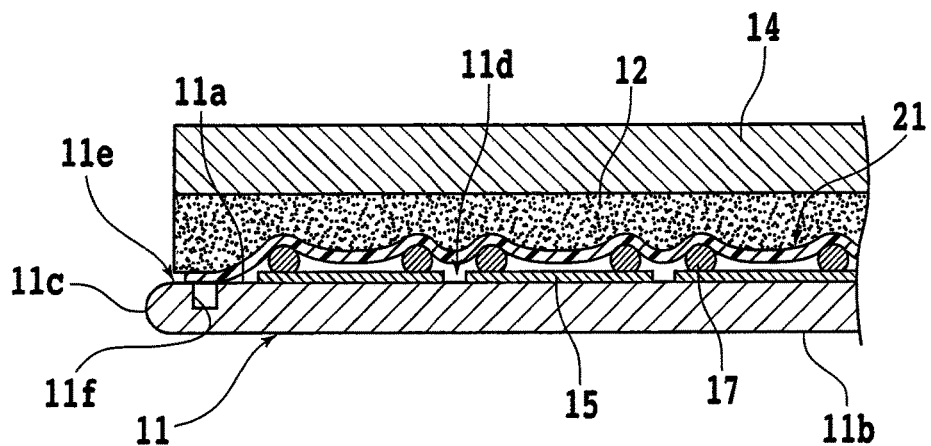
FIG. 3A is a schematic sectional view showing a manner of pressing the protective film against the front side of the wafer in the close contact making step.
Figure 3B:
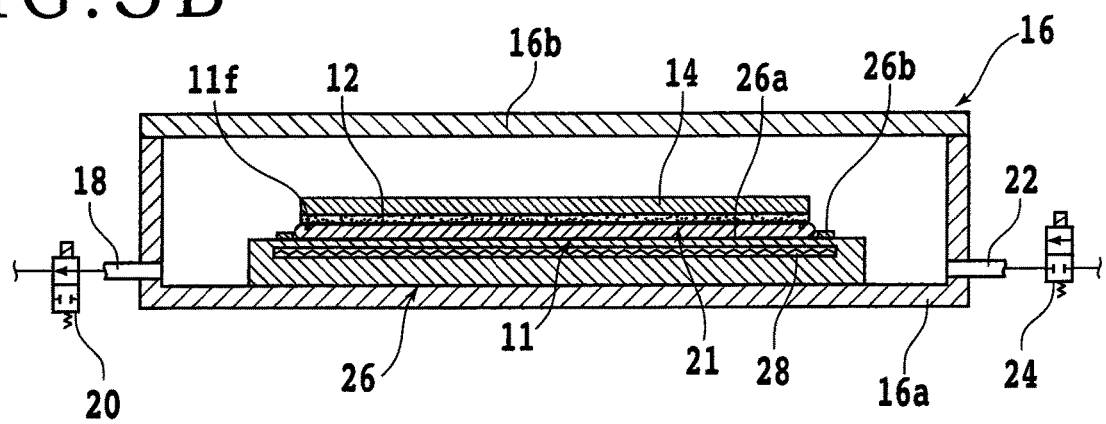
FIG. 3B is a schematic sectional view showing a manner of bringing the protective film into close contact with the front side of the wafer in the close contact making step.
Figure 3C:
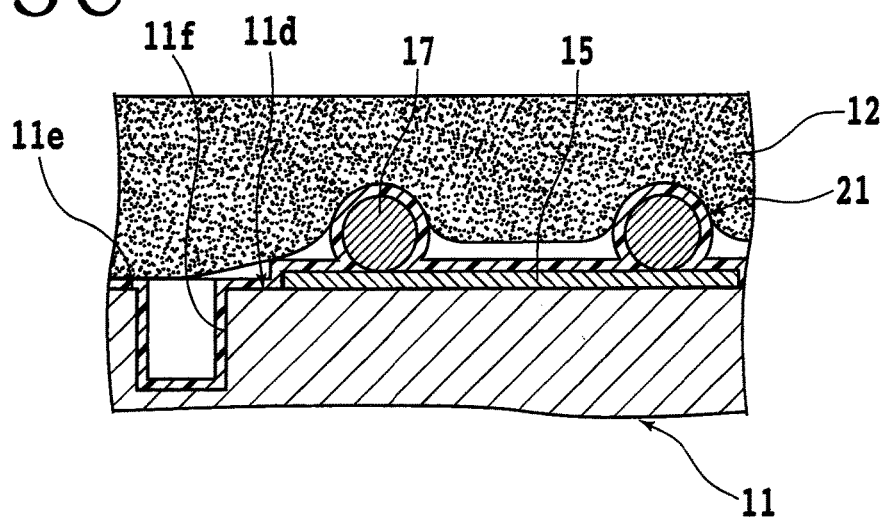
FIG. 3C is a schematic enlarged sectional view of a part of the wafer in the condition where the protective film has been brought into close contact with the front side of the wafer in the close contact making step.

After covering the device area 11d with the protective film 21, the protective film 21 is brought into close contact with the front side 11a of the wafer 11. FIG. 3A is a schematic sectional view showing a manner of pressing the protective film 21 against the front side 11a of the wafer 11, FIG. 3B is a schematic sectional view showing a manner of bringing the protective film 21 into close contact with the front side 11a of the wafer 11, and FIG. 3C is an enlarged sectional view of a part of the wafer 11 in the condition where the protective film 21 is in close contact with the front side 11a of the wafer 11.

As shown in FIG. 3A, a weight 14 is placed through a cushion member 12 such as a sponge on the front side 11a of the wafer 11 (i.e., on the protective film 21 covering the front side 11a), thereby pressing the protective film 21 against the front side 11a of the wafer 11. In other words, the protective film 21 is pressed against the front side 11a of the wafer 11 by applying a pressure from the weight 14 through the cushion member 12 to the protective film 21. As a result, a part of the protective film 21 comes into contact with the front side 11a of the wafer 11. Thereafter, as shown in FIG. 3B, the wafer 11 in the condition shown in FIG. 3A is loaded into a vacuum chamber 16.

The vacuum chamber 16 includes a casing member 16a having an upper opening having a size allowing the pass of the wafer 11 and a door member 16b for closing the upper opening of the casing member 16a. The casing member 16a is connected through an outlet pipe 18 and a valve 20 to a vacuum source (not shown). The casing member 16a is also connected to an inlet pipe 22 and a valve 24 for introducing the outside air (atmospheric air) into the vacuum chamber 16. A support table 26 for supporting the wafer 11 is provided in the casing member 16a. The support table 26 has a substantially flat upper surface, which functions as a support surface 26a for supporting the wafer 11. The support surface 26a is provided with a projecting guide portion 26b for positioning the wafer 11 on the support surface 26a. A heater 28 for heating the protective film 21 is provided inside the support table 26.

The wafer 11 is loaded into the vacuum chamber 16 through the upper opening of the casing member 16a in the condition where the weight 14 is placed through the cushion member 12 on the front side 11a of the wafer 11. Thereafter, the wafer 11 is placed on the support table 26 in the condition where the back side 11b of the wafer 11 is in contact with the support surface 26a of the support table 26. Thereafter, as shown in FIG. 3B, the door member 16b is closed to cover the upper opening of the casing member 16a, thereby defining the inside space of the vacuum chamber 16. In this condition, the valve 24 is closed, and the valve 20 is next opened to thereby evacuate the inside space of the vacuum chamber 16. As a result, the protective film 21 is pressed against the front side 11a of the wafer 11 under vacuum. Further, a gas (air) left between the protective film 21 and the front side 11a of the wafer 11 is removed.

After sufficiently evacuating the inside space of the vacuum chamber 16, the valve 20 is closed and the valve 24 is next opened to introduce the outside air (atmospheric air) into the inside space of the vacuum chamber 16. As a result, atmospheric pressure is applied to the protective film 21, so that the protective film 21 can be brought into close contact with the front side 11a of the wafer 11 so as to follow the shape of each bump 17 formed on the front side 11a of the wafer 11 as shown in FIG. 3C. At this time, a part of the protective film 21 is forced into the annular groove 11f by the atmospheric pressure to come into close contact with the inside surface of the annular groove 11f. In applying the atmospheric pressure to the protective film 21, the heater 28 may be operated to heat the protective film 21, thereby softening the protective film 21. In this case, the protective film 21 can be brought into close contact with the wafer 11 more easily.

Figure 4A:
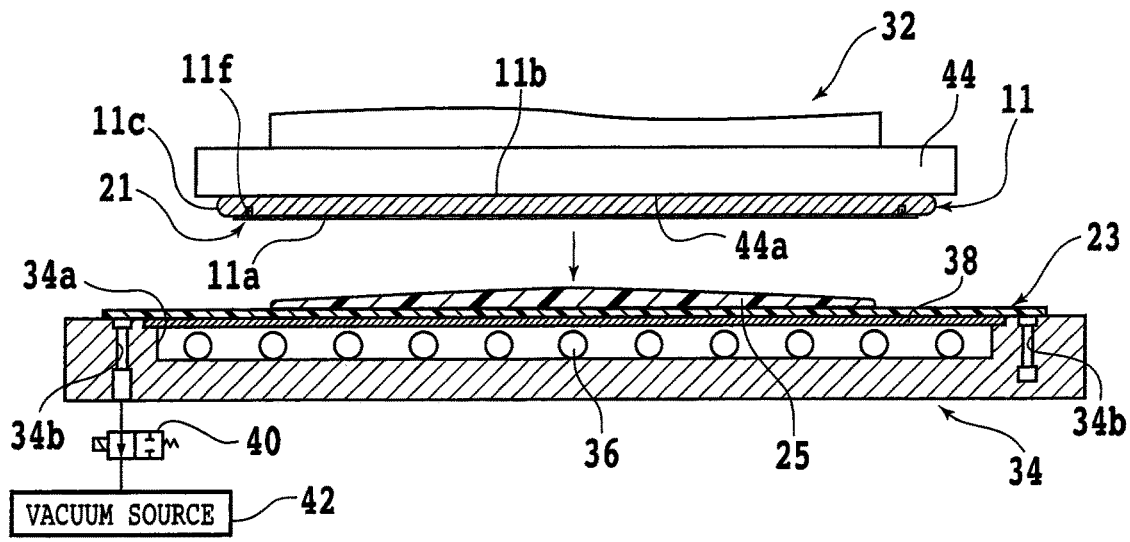
FIG. 4A is a schematic sectional side view showing a manner of pressing the wafer through the protective film to a liquid resin applied to a sheet in a protective member fixing step in the wafer processing method according to this preferred embodiment.
Figure 4B:
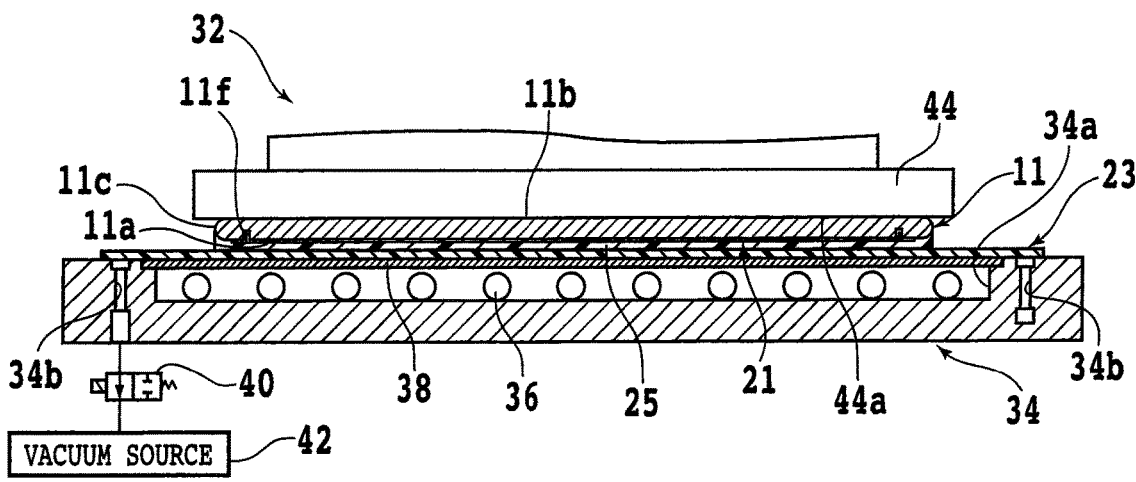
FIG. 4B is a schematic sectional side view showing a manner of curing the liquid resin to thereby form a protective member from the liquid resin, thereby fixing the protective member through the protective film to the front side of the wafer in the protective member fixing step.
Figure 4C:
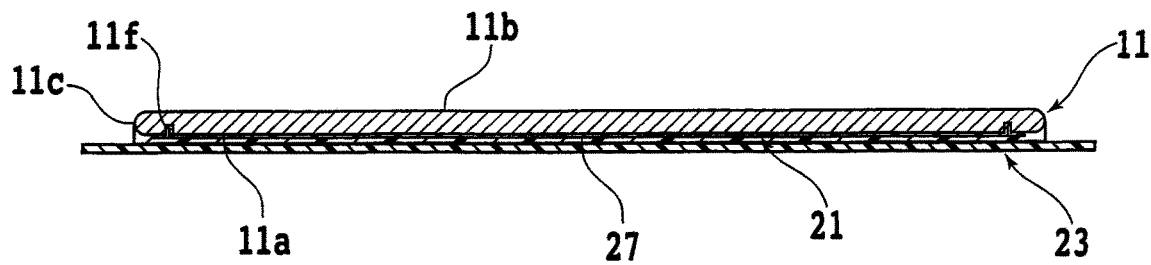
FIG. 4C is a schematic sectional view showing the wafer in the condition where the protective member supported to the sheet has been fixed through the protective film to the front side of the wafer in the protective member fixing step.

After performing the close contact making step, the protective member fixing step is performed to cover the protective film 21 and an exposed part of the peripheral marginal area 11e with a protective member formed from a liquid resin, thereby fixing the protective member through the protective film 21 to the front side 11a of the wafer 11. FIG. 4A is a schematic sectional side view showing a manner of pressing the wafer 11 through the protective film 21 against a liquid resin applied to a sheet, FIG. 4B is a schematic sectional side view showing a manner of curing the liquid resin to thereby form the protective member, thereby fixing the protective member through the protective film 21 to the front side 11a of the wafer 11, and FIG. 4C is a schematic sectional view showing the wafer 11 in the condition where the protective member supported to the sheet is fixed through the protective film 21 to the front side 11a of the wafer 11. In FIGS. 4A and 4B, a part of the components is shown by functional blocks.

The protective member fixing step may be performed by using a protective member fixing apparatus 32 shown in FIGS. 4A and 4B. The protective member fixing apparatus 32 includes a holding table 34 for holding a substantially flat sheet (carrier sheet) 23 formed of resin, for example. The holding table 34 has an upper surface formed with a central circular recess 34a larger in diameter than the wafer 11. An ultraviolet light source 36 is provided in the recess 34a. The upper end opening of the recess 34a is covered with a plate 38 capable of transmitting at least a part of ultraviolet light applied from the ultraviolet light source 36. The sheet 23 is supported at its central portion by the plate 38. A suction passage 34b is formed inside the holding table 34 in a peripheral area surrounding the recess 34a, and one end of the suction passage 34b opens to the upper surface of the holding table 34 in this peripheral area, so as to hold a peripheral portion of the sheet 23 under suction.

The other end of the suction passage 34b is connected through a valve 40 to a vacuum source 42. Accordingly, by applying a vacuum generated from the vacuum source 42 through the suction passage 34b to the peripheral portion of the sheet 23, the sheet 23 can be held on the holding table 34 under suction. There is provided above the holding table 34 a wafer holding unit 44 for holding the wafer 11. The wafer holding unit 44 has a lower surface 44a for holding the wafer 11. The wafer holding unit 44 is vertically movably supported by a moving mechanism (not shown), so that the wafer holding unit 44 holding the wafer 11 can be moved in a vertical direction by operating this moving mechanism. The wafer holding unit 44 may be of a vacuum suction type such that a vacuum is used to hold the wafer 11 under suction or may be of an electrostatic attraction type such that an electrostatic force is used to hold the wafer 11.

In the protective member fixing step, a liquid resin 25 is previously applied to the upper surface of the sheet 23 as shown in FIG. 4A, and the lower surface of the sheet 23 is held on the holding table 34. Further, the back side 11b of the wafer 11 is held on the lower surface 44a of the wafer holding unit 44. Accordingly, the protective film 21 kept in close contact with the front side 11a of the wafer 11 is opposed to the liquid resin 25 applied to the sheet 23. The liquid resin 25 is a liquid resin curable by the ultraviolet light applied from the ultraviolet light source 36. For example, TEMPLOC (registered trademark) manufactured by Denka Co., Ltd. may be used as the liquid resin 25. As shown in FIG. 4A, the central portion of the liquid resin 25 is preferably slightly raised on the sheet 23. With this configuration, it is possible to suppress that a gas (air) may be left between the protective film 21 and the liquid resin 25 in covering the protective film 21 with the liquid resin 25.

While the sheet 23 is held on the holding table 34 in the condition where the liquid resin 25 is previously applied to the upper surface of the sheet 23 in this preferred embodiment, the sheet 23 only may be first held on the holding table 34, and the liquid resin 25 may be next applied to the upper surface of the sheet 23.

Thereafter, as shown in FIG. 4B, the wafer holding unit 44 is lowered to press the front side 11a of the wafer 11 through the protective film 21 against the liquid resin 25. As a result, the liquid resin 25 is spread in the radial direction of the wafer 11 so as to fully cover the protective film 21 and also cover an exposed part of the peripheral marginal area 11e. In this preferred embodiment, the amount of the liquid resin 25 to be applied and the amount of lowering of the wafer holding unit 44 are adjusted so that the whole of the front side 11a of the wafer 11 is covered with the liquid resin 25. That is, the liquid resin 25 is applied so that not only the whole of the protective film 21 is covered with the liquid resin 25, but also the chamfered portion of the outer circumference 11c on the front side 11a of the wafer 11 is covered with the liquid resin 25. Thereafter, ultraviolet light is applied from the ultraviolet light source 36 toward the liquid resin 25 to thereby cure the liquid resin 25. Accordingly, as shown in FIG. 4C, the liquid resin 25 is formed into a protective member 27 fully covering the protective film 21 and also covering an exposed part of the peripheral marginal area 11e, and this protective member 27 is fixed to the front side 11a of the wafer 11. Thusly, the protective film 21 on the front side 11a of the wafer 11 is fully covered with the protective member 27 formed from the liquid resin 25, thereby fixing the protective member 27 through the protective film 21 to the front side 11a of the wafer 11. Further, the sheet 23 is fixed to the protective member 27. In this preferred embodiment, the chamfered portion of the outer circumference 11c on the front side 11a of the wafer 11 is also covered with the protective member 27.

Figure 5A:
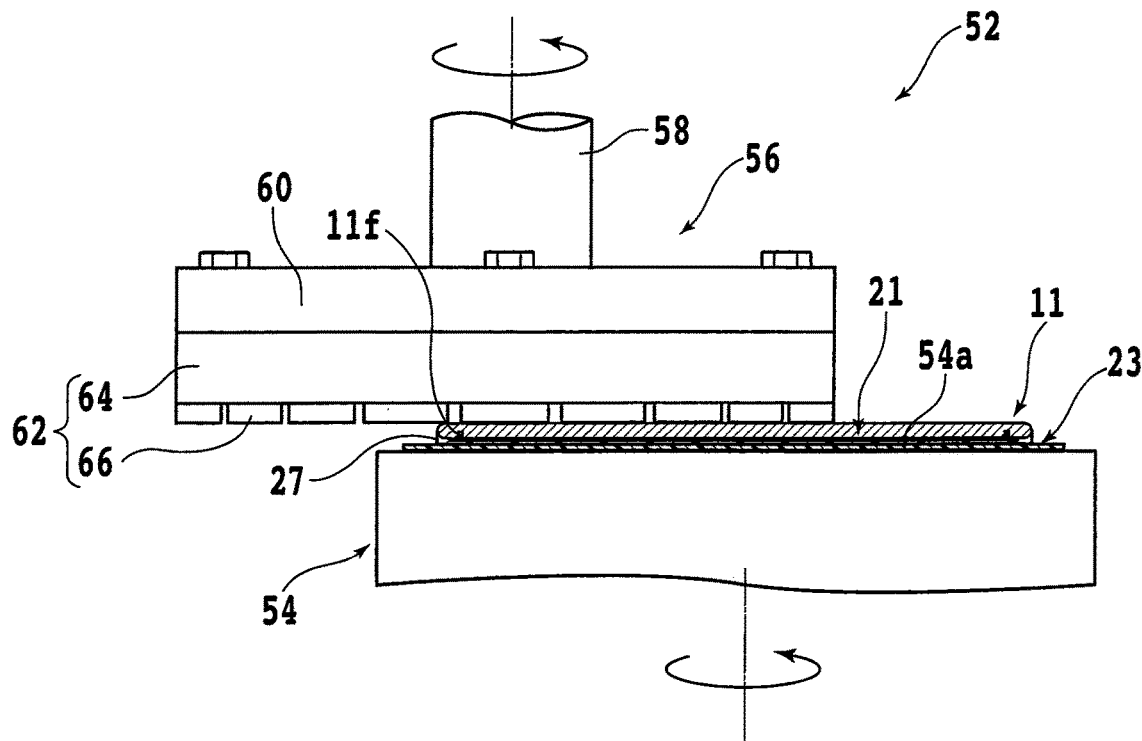
FIG. 5A is a schematic sectional side view showing a manner of grinding the back side of the wafer in a grinding step in the wafer processing method according to this preferred embodiment.
Figure 5B:
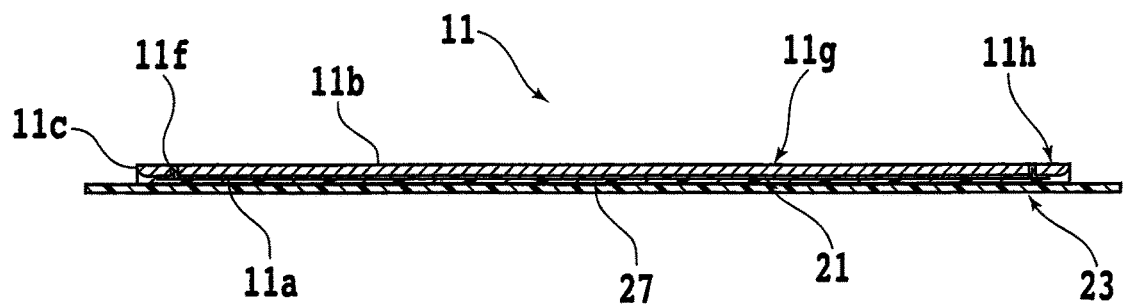
FIG. 5B is a schematic sectional view of the wafer processed by the grinding step.

After performing the protective member fixing step, the grinding step is performed to grind the back side 11b of the wafer 11. FIG. 5A is a schematic sectional side view showing a manner of grinding the back side 11b of the wafer 11, and FIG. 5B is a schematic sectional view of the wafer 11 processed by the grinding step.

The grinding step may be performed by using a grinding apparatus 52 shown in FIG. 5A. The grinding apparatus 52 includes a chuck table (holding table) 54 for holding the wafer 11 under suction. The chuck table 54 is connected to a rotational drive source (not shown) such as a motor. Accordingly, the chuck table 54 is adapted to be rotated about its axis substantially parallel to a vertical direction, by operating this rotational drive source. A moving mechanism (not shown) is provided below the chuck table 54, so as to move the chuck table 54 in a horizontal direction. The chuck table 54 has an upper surface, a part of which is formed as a holding surface 54a for holding under suction the sheet 23 fixed through the protective member 27 to the wafer 11. The holding surface 54a is connected through a suction passage (not shown) to a vacuum source (not shown), and the suction passage is formed inside the chuck table 54. Accordingly, by applying a vacuum generated from the vacuum source through the suction passage to the holding surface 54a in the condition where the sheet 23 is in contact with the holding surface 54a, the wafer 11 can be held through the sheet 23 and the protective member 27 on the chuck table 54 under suction. As a modification, the chuck table 54 may be replaced by another type of chuck table capable of holding the wafer 11 by using a mechanical method or an electrical method.

A grinding unit 56 is provided above the chuck table 54. The grinding unit 56 includes a spindle housing (not shown) supported to an elevating mechanism (not shown). A spindle 58 is rotatably supported in the spindle housing. A disk-shaped mount 60 is fixed to the lower end of the spindle 58. A grinding wheel 62 is mounted on the lower surface of the mount 60, and the grinding wheel 62 has substantially the same diameter as that of the mount 60. The grinding wheel 62 includes a wheel base 64 formed of metal such as stainless steel and aluminum. A plurality of abrasive members 66 are fixed to the lower surface of the wheel base 64 so as to be annularly arranged along the outer circumference of the wheel base 64. A rotational drive source (not shown) such as a motor is connected to the upper end (base end) of the spindle 58. Accordingly, the grinding wheel 62 fixed to the spindle 58 is adapted to be rotated about its axis substantially parallel to a vertical direction, by operating this rotational drive source to produce a rotating force. A nozzle (not shown) for supplying a grinding fluid such as pure water to the wafer 11 is provided inside or in the vicinity of the grinding unit 56.

In the grinding step, the wafer 11 is first held on the chuck table 54 of the grinding apparatus 52 under suction. More specifically, the wafer 11 is first placed on the holding surface 54a of the chuck table 54 in the condition where the sheet 23 fixed through the protective member 27 to the wafer 11 is in contact with the holding surface 54a. That is, the back side 11b of the wafer 11 is exposed upward in this condition. Thereafter, the vacuum source is operated to apply a vacuum to the holding surface 54a of the chuck table 54. Accordingly, the wafer 11 is held through the sheet 23 and the protective member 27 on the chuck table 54 under suction in the condition where the back side 11b of the wafer 11 is exposed upward. Thereafter, the chuck table 54 is moved to the position below the grinding unit 56. In this condition, both the chuck table 54 and the grinding wheel 62 are rotated and the spindle housing (the spindle 58 and the grinding wheel 62) is then lowered as supplying the grinding fluid to the back side 11b of the wafer 11 as shown in FIG. 5A.

The lowering speed (feed speed) of the spindle housing is adjusted so that the lower surface of each abrasive member 66 is pressed against the back side 11b of the wafer 11 by a suitable force. Accordingly, the back side 11b of the wafer 11 can be ground by the grinding wheel 62 to thereby reduce the thickness of the wafer 11. When the thickness of the wafer 11 is reduced to a predetermined finished thickness and the bottom of the annular groove 11f is exposed to the back side 11b of the wafer 11 as shown in FIG. 5B, this grinding step is finished. As the result of this grinding step, the wafer 11 is separated along the annular groove 11f into a circular portion 11g including the device area 11d and an annular portion 11h including the peripheral marginal area 11e. While one set of grinding unit 56 is used to grind the back side 11b of the wafer 11 in this preferred embodiment, two or more sets of grinding units may be used to grind the back side 11b of the wafer 11. For example, a first set of abrasive members each containing large-sized abrasive grains may be first used to perform coarse grinding to the back side 11b of the wafer 11, and a second set of abrasive members each containing small-sized abrasive grains may be next used to perform fine grinding to the back side 11b of the wafer 11. In this case, the flatness of the back side 11b of the wafer 11 can be improved without greatly increasing the time required for grinding.

Figure 6:
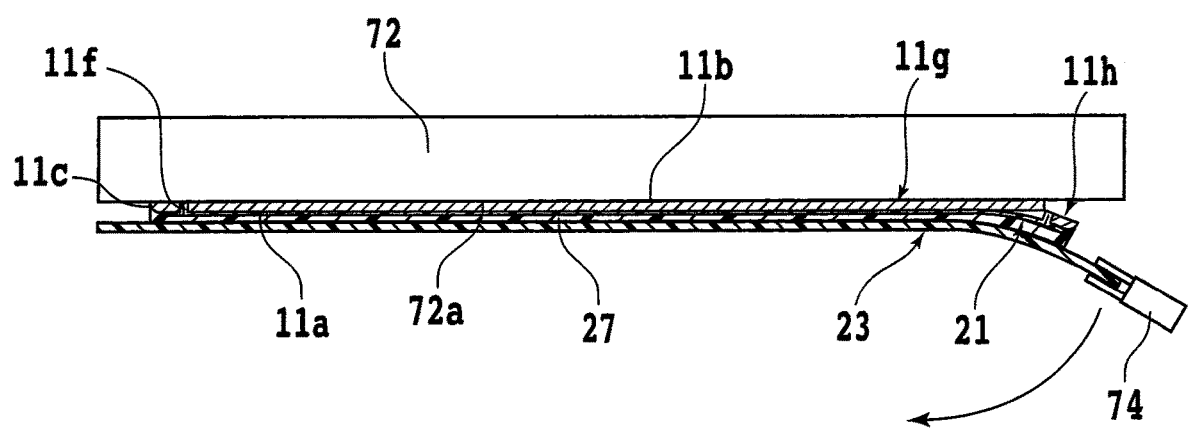
FIG. 6 is a schematic sectional side view showing a manner of peeling the protective film and the protective member from the wafer in a peeling step in the wafer processing method according to this preferred embodiment.

After performing the grinding step, the peeling step is performed to peel the protective film 21 and the protective member 27 from the circular portion 11g of the wafer 11 thinned by the grinding step and remove the protective film 21 and the protective member 27 together with the annular portion 11h of the wafer 11. FIG. 6 is a schematic sectional side view showing a manner of peeling the protective film 21 and the protective member 27 from the wafer 11. In the peeling step, a wafer holding unit 72 having a holding surface 72a is used to hold the wafer 11. That is, the back side 11b of the wafer 11 is held on the holding surface 72a of the wafer holding unit 72. The wafer holding unit 72 may be of a vacuum suction type such that a vacuum is used to hold the wafer 11 on the holding surface 72a under suction or may be of an electrostatic attraction type such that an electrostatic force is used to hold the wafer 11 on the holding surface 72a.

After holding the wafer 11 on the holding surface 72a of the wafer holding unit 72, a peeling unit 74 is used to peel the protective member 27 and the protective film 21. More specifically, a peripheral portion of the sheet 23 is gripped by the peeling unit 74. Thereafter, the wafer holding unit 72 and the peeling unit 74 are relatively moved so that the peripheral portion of the sheet 23 is moved away from the wafer 11 as shown in FIG. 6. At this time, the protective film 21 is peeled from the device area 11d of the circular portion 11g of the wafer 11. Accordingly, the annular portion 11h is moved away from the circular portion 11g, and all of the protective film 21, the protective member 27, and the sheet 23 can be peeled together from the circular portion 11g of the wafer 11 as shown in FIG. 6. The protective film 21, the protective member 27, and the sheet 23 peeled from the circular portion 11g are discarded together with the annular portion 11h. To facilitate the removal of the annular portion 11h from the wafer holding unit 72, the holding force (attraction) for the annular portion 11h by the wafer holding unit 72 may be previously set smaller than that for the circular portion 11g.

In the wafer processing method according to the above preferred embodiment, the device area 11d where the devices 15 each having the bumps (asperities) 17 are formed is first covered with the protective film 21, and the protective film 21 is then brought into close contact with the device area 11d in such a manner as to follow the shape of each bump 17. Thereafter, the protective film 21 and an exposed part of the peripheral marginal area 11e are covered with the protective member 27 formed from the liquid resin 25 curable by ultraviolet light (external stimulus), thereby fixing the protective member 27 through the protective film 21 to the front side 11a of the wafer 11. Accordingly, by forming the protective member 27 having a suitable thickness, the asperities due to the bumps 17 formed on the front side 11a of the wafer 11 can be sufficiently absorbed.

In the wafer processing method according to this preferred embodiment, the protective film 21 is not bonded to the device area 11d of the wafer 11, but is merely in close contact with the device area 11d. Accordingly, the protective member 27 and the protective film 21 can be simply peeled from the device area 11d without the need for any extensive work dedicated to peeling, such as immersion of the wafer 11 in a solution or heating of the wafer 11 at high temperatures. Further, since no adhesive is left in the device area 11d, it is unnecessary to perform any operation for removing the adhesive. Thus, according to this preferred embodiment, it is possible to provide a wafer processing method which can exhibit the effects that the influence of the asperities due to the bumps 17 present on the front side 11a of the wafer 11 can be sufficiently suppressed in grinding the back side 11b of the wafer 11 and that the peeling operation after grinding can also be simply performed.

Further, in the wafer processing method according to this preferred embodiment, an exposed part of the peripheral marginal area 11e is also covered with the protective member 27 formed from the liquid resin 25 curable by ultraviolet light. Accordingly, the protective member 27 adheres directly to the wafer 11 in the peripheral marginal area 11e, that is, the protective member 27 is bonded to the peripheral marginal area 11e of the wafer 11. As a result, although the protective film 21 does not have adhesion by an adhesive (paste) in this preferred embodiment, there is no possibility that the protective film 21 and the protective member 27 may be peeled from the wafer 11 in grinding the wafer 11.

Furthermore, in the wafer processing method according to this preferred embodiment, the annular groove 11f having a depth greater than the finished thickness of the wafer 11 is first formed on the front side 11a of the wafer 11 along the inner circumference of the peripheral marginal area 11e. Thereafter, the back side 11b of the wafer 11 is ground to thin the wafer 11 to the finished thickness. Accordingly, by grinding the wafer 11, the wafer 11 is separated along the annular groove 11f into the circular portion 11g including the device area 11d and the annular portion 11h including the peripheral marginal area 11e. As a result, it is unnecessary to peel the protective member 27 from the annular portion 11h in the peeling step. That is, only by moving the annular portion 11h away from the circular portion 11g in the peeling step, the protective member 27 and the protective film 21 can be peeled from the device area 11d of the circular portion 11g.

The present invention is not limited to the above preferred embodiment, but various modifications may be made. For example, while the liquid resin 25 is a liquid resin curable by ultraviolet light as external stimulus in this preferred embodiment, another type of liquid resin curable by any external stimulus (e.g., heat) other than ultraviolet light may be used as the liquid resin 25.

Further, in this preferred embodiment, the wafer 11 is pressed through the protective film 21 against the liquid resin 25 applied to the sheet 23, thereby fixing the protective member 27 to the wafer 11. As a modification, the liquid resin 25 may be dropped onto the wafer 11 or the protective film 21 without using the sheet 23, thereby fixing the protective member 27 to the wafer 11. In this case, the exposed surface of the protective member 27 is preferably flattened by using a surface planer or the like. By flattening the exposed surface of the protective member 27 to be held on the chuck table 54 in grinding the wafer 11, the back side 11b of the wafer 11 as a work surface can be ground flat in the grinding step.

Further, in the above preferred embodiment, the weight 14 is placed through the cushion member 12 on the front side 11a of the wafer 11 (i.e., on the protective film 21 covering the front side 11a), so as to press the protective film 21 against the front side 11a of the wafer 11. In this condition, the protective film 21 is brought into close contact with the front side 11a of the wafer 11. However, any other methods may be used to bring the protective film 21 into close contact with the front side 11a of the wafer 11.

Figure 7A:
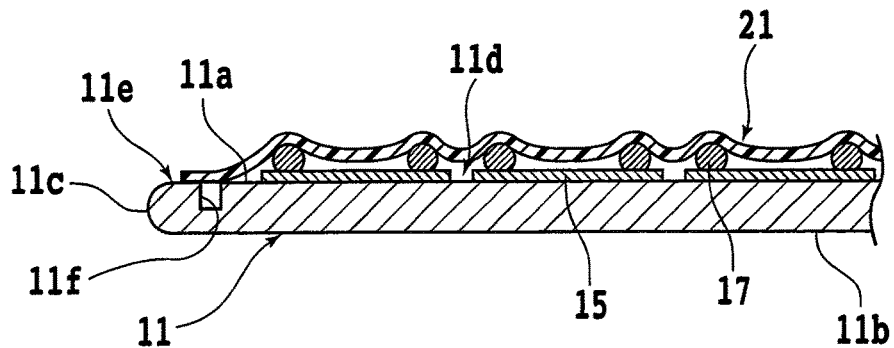
FIG. 7A is a schematic sectional view showing a condition where the front side of the wafer is covered with the protective film in a close contact making step in a wafer processing method according to a first modification.
Figure 7B:
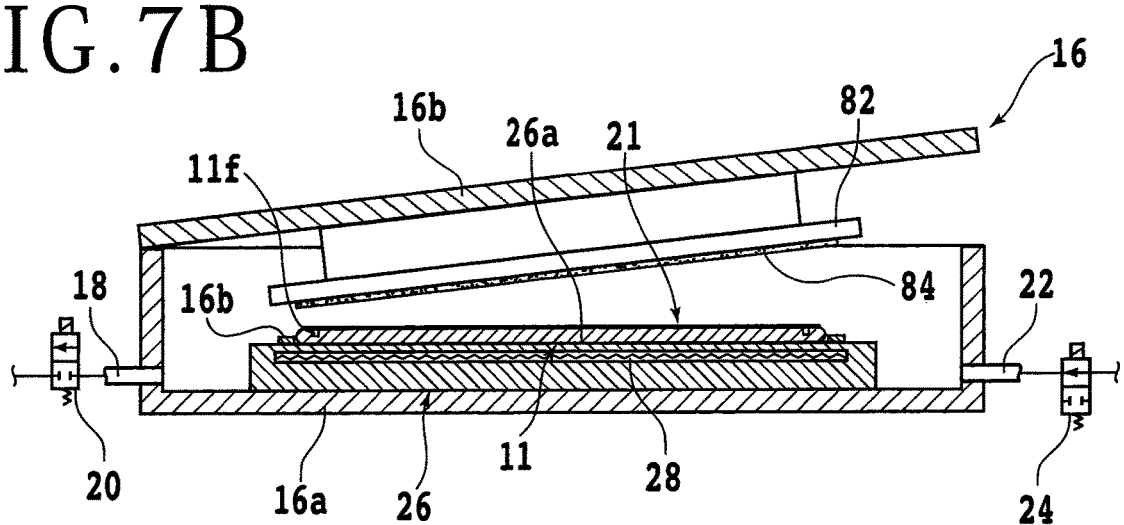
FIGS. 7B and 7C are schematic sectional side views showing a manner of bringing the protective film into close contact with the front side of the wafer in the close contact making step according to the first modification.
Figure 7C:
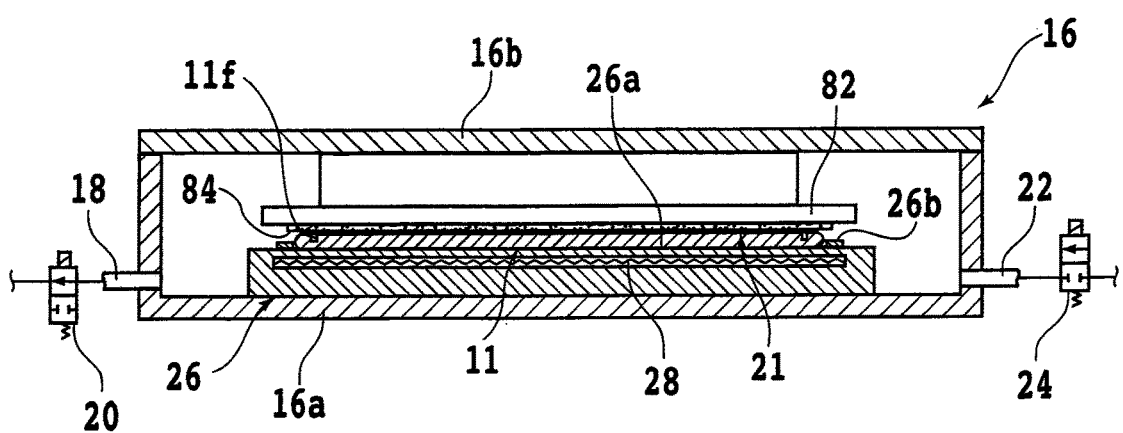

FIG. 7A is a schematic sectional view showing a condition where the front side 11a of the wafer 11 is covered with the protective film 21 in a close contact making step in a wafer processing method according to a first modification, and FIGS. 7B and 7C are schematic sectional side views showing a manner of bringing the protective film 21 into close contact with the front side 11a of the wafer 11 in the close contact making step according to the first modification. The other steps in the wafer processing method according to the first modification may be the same as those in the wafer processing method according to the above preferred embodiment.

In the close contact making step according to the first modification, the protective film 21 is first superimposed on the front side 11a of the wafer 11 (the device area 11d) to thereby cover the front side 11a of the wafer 11 with the protective film 21 as shown in FIG. 7A. This procedure is similar to that in the above preferred embodiment. Thereafter, the wafer 11 is loaded into a vacuum chamber 16 as shown in FIG. 7B. The basic configuration of the vacuum chamber 16 to be used in the close contact making step according to the first modification is the same as that of the vacuum chamber 16 shown in FIG. 7B according to the above preferred embodiment except that the vacuum chamber 16 according to the first modification includes a pressing unit (pressing member) 82 for pressing the protective film 21 against the wafer 11, and the pressing unit 82 is provided on the inner wall surface of the door member 16b as shown in FIG. 7B. Further, a cushion member 84 such as a sponge is provided on the lower surface of the pressing unit 82 to be opposed to the support table 26. As shown in FIGS. 7B and 7C, the wafer 11 is placed on the support table 26 of the vacuum chamber 16, and the door member 16b is closed, so that the protective film 21 is pressed by the pressing unit 82 through the cushion member 84. Accordingly, the protective film 21 is pressed against the front side 11a of the wafer 11 by the pressing unit 82. That is, a part of the protective film 21 comes into contact with the front side 11a of the wafer 11.

Thereafter, as shown in FIG. 7C, the valve 24 is closed, and the valve 20 is next opened to thereby evacuate the inside space of the vacuum chamber 16. As a result, the protective film 21 is pressed against the front side 11a of the wafer 11 under vacuum. Further, a gas (air) left between the protective film 21 and the front side 11a of the wafer 11 is removed. After sufficiently evacuating the inside space of the vacuum chamber 16, the valve 20 is closed and the valve 24 is next opened to introduce the outside air (atmospheric air) into the inside space of the vacuum chamber 16. As a result, atmospheric pressure is applied to the protective film 21, so that the protective film 21 can be brought into close contact with the front side 11a of the wafer 11 so as to follow the shape of each bump 17 formed on the front side 11a of the wafer 11. At this time, a part of the protective film 21 is forced into the annular groove 11f by the atmospheric pressure to come into close contact with the inside surface of the annular groove 11f. In applying the atmospheric pressure to the protective film 21, the heater 28 may be operated to heat the protective film 21, thereby softening the protective film 21. In this case, the protective film 21 can be brought into close contact with the wafer 11 more easily.

Figure 8A:
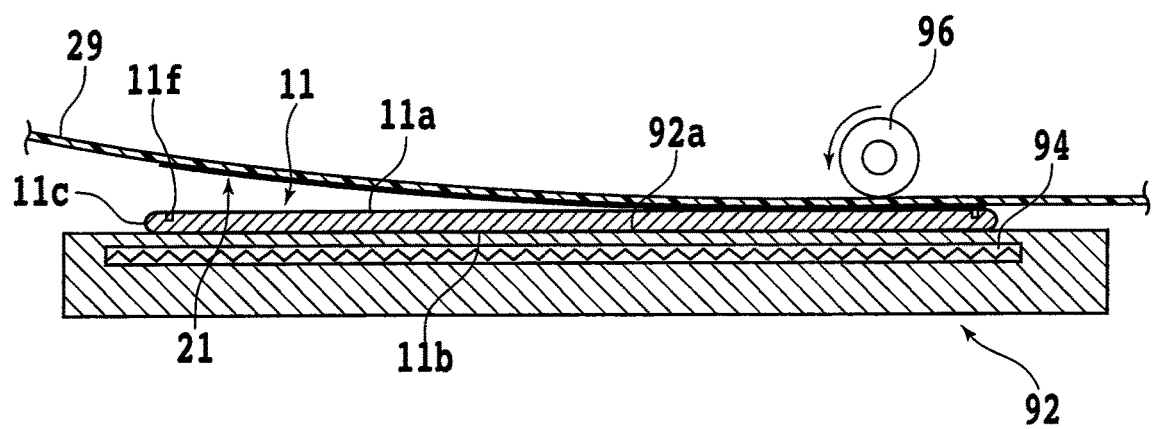
FIGS. 8A and 8B are schematic sectional views showing a manner of bringing the protective film into close contact with the front side of the wafer in a close contact making step in a wafer processing method according to a second modification.
Figure 8B:
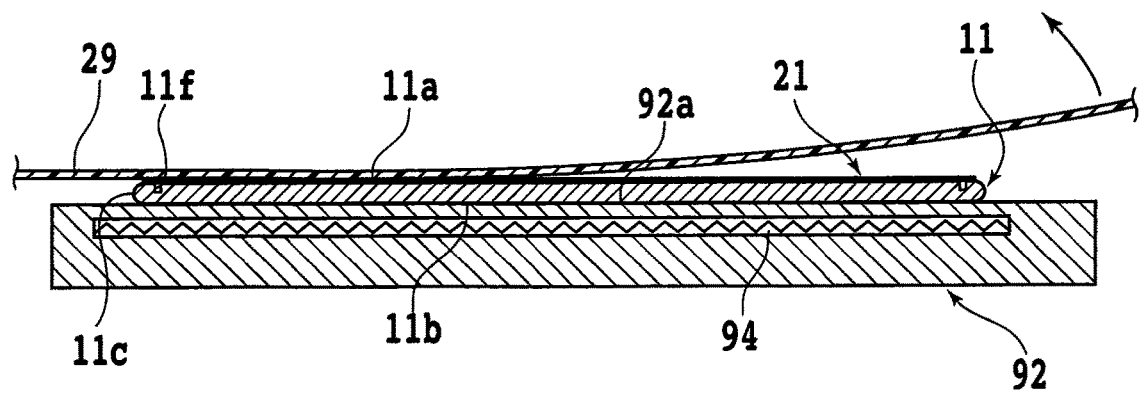

FIGS. 8A and 8B are schematic sectional views showing a manner of bringing the protective film 21 into close contact with the front side 11a of the wafer 11 in a close contact making step in a wafer processing method according to a second modification. The other steps in the wafer processing method according to the second modification may be the same as those in the wafer processing method according to the above preferred embodiment.

In the close contact making step according to the second modification, the back side 11b of the wafer 11 is supported on a support surface 92a of a support table 92. The basic configuration of the support table 92 may be the same as that of the support table 26. Thereafter, the protective film 21 previously held on the lower surface of a release sheet 29 is opposed to the front side 11a of the wafer 11 (the device area 11d). Thereafter, a pressure roller 96 is used to apply a downward pressure to the upper surface of the release sheet 29, thereby pressing the protective film 21 against the front side 11a of the wafer 11 as shown in FIG. 8A. At this time, a heater 94 provided inside the support table 92 is preferably operated to heat the protective film 21, thereby softening the protective film 21. Accordingly, the protective film 21 can be brought into close contact with the device area 11d of the wafer 11. Finally, the release sheet 29 is released from the protective film 21 as shown in FIG. 8B. As a modification, this close contact making step using the pressure roller 96 may be performed in the vacuum chamber 16 as in the above preferred embodiment or the first modification.

Figure 9:
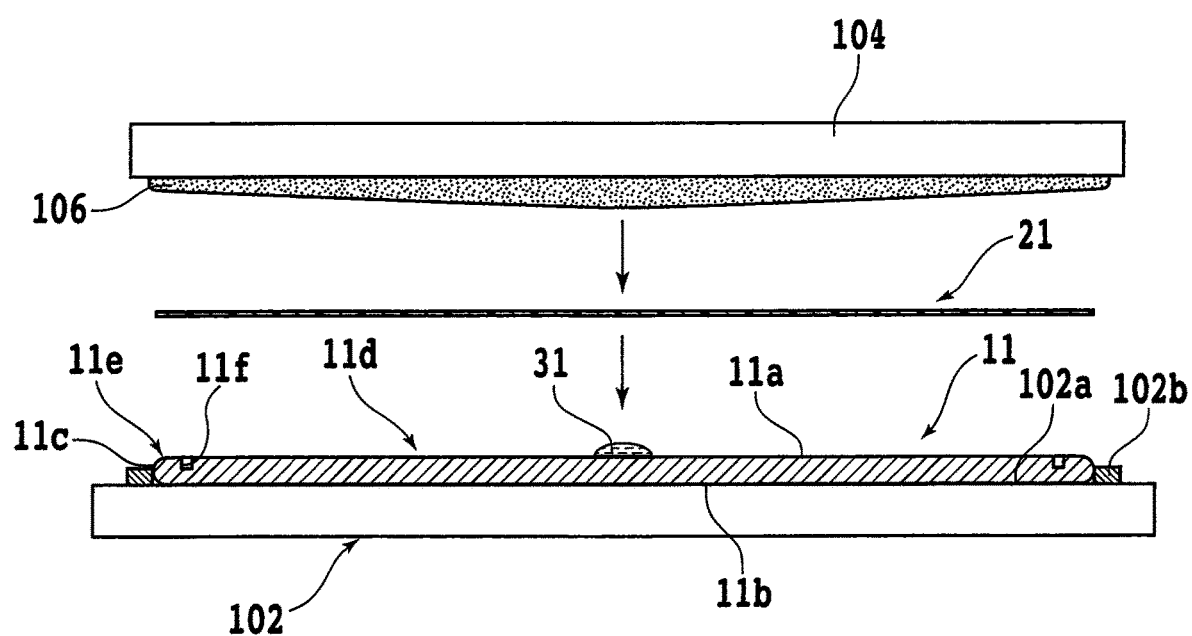
FIG. 9 is a schematic sectional side view showing a manner of bringing the protective film into close contact with the front side of the wafer in a close contact making step in a wafer processing method according to a third modification.

FIG. 9 is a schematic sectional side view showing a manner of bringing the protective film 21 into close contact with the front side 11a of the wafer 11 in a close contact making step in a wafer processing method according to a third modification. The other steps in the wafer processing method according to the third modification may be the same as those in the wafer processing method according to the above preferred embodiment. In the close contact making step according to the third modification, a liquid 31 is first supplied to the front side 11a of the wafer 11 as shown in FIG. 9. Thereafter, the protective film 21 is pressed against the front side 11a of the wafer 11 with the liquid 31 interposed therebetween.

More specifically, the back side 11b of the wafer 11 is supported on a support surface 102a of a support table 102. The basic configuration of the support table 102 may be the same as that of the support table 26 or the like. As shown in FIG. 9, the support surface 102a is provided with a projecting guide portion 102b for positioning the wafer 11 on the support surface 102a. Thereafter, the liquid 31 is supplied to the front side 11a of the wafer 11. The liquid 31 to be supplied to the wafer 11 is not especially limited in kind, but it is desirable to use a liquid hard to vaporize at room temperature (20° C.) and having a boiling point not so high (e.g., 100° C. or less). For example, water may be used as the liquid 31. In this modification, the liquid 31 is supplied to the center of the front side 11a of the wafer 11. Thereafter, the protective film 21 is opposed to the front side 11a of the wafer 11. More specifically, the protective film 21 is superimposed through the liquid 31 on the front side 11a of the water 11 so as to fully cover the annular groove 11f formed on the front side 11a along the inner circumference of the peripheral marginal area 11e. Thereafter, a pressing unit 104 provided above the support table 102 is used to press the protective film 21 against the front side 11a of the wafer 11.

The pressing unit 104 has a substantially flat lower surface larger in diameter than the wafer 11. A cushion member 106 such as a sponge is provided on the lower surface of the pressing unit 104. The cushion member 106 is larger in diameter than the wafer 11. The cushion member 106 has a thickness gradually increasing from the outer circumference to the center in the radial direction. Accordingly, when the pressing unit 104 is gradually lowered, the center of the cushion member 106 first comes into contact with the upper surface of the protective film 21. When the pressing unit 104 is further lowered, a contact area between the cushion member 106 and the protective film 21 is gradually increased, so that the protective film 21 is pressed against the front side 11a of the wafer 11 in a radially outward direction starting from the center of the wafer 11. The lowering of the pressing unit 104 is continued until the whole of the protective film 21 is pressed against the wafer 11.

Accordingly, the protective film 21 can be brought into close contact with the front side 11a of the wafer 11 so as to follow the shape of each bump 17 formed on the front side 11a of the wafer 11. In this modification, the liquid 31 is first supplied to the front side 11a of the wafer 11, so that the protective film 21 is brought into close contact with the front side 11a of the wafer 11 with a film of the liquid 31 interposed therebetween. In pressing the protective film 21 against the wafer 11, a heater (not shown) may be operated to heat the protective film 21, thereby softening the protective film 21. In this case, the protective film 21 can be brought into close contact with the wafer 11 more easily. This close contact making step using the pressing unit 104 may be performed in the vacuum chamber 16 as in the above preferred embodiment or the first modification.

After performing the close contact making step, a protective member fixing step and a grinding step are performed in the similar procedure to that in the above preferred embodiment, and then a peeling step is performed.

Figure 10:
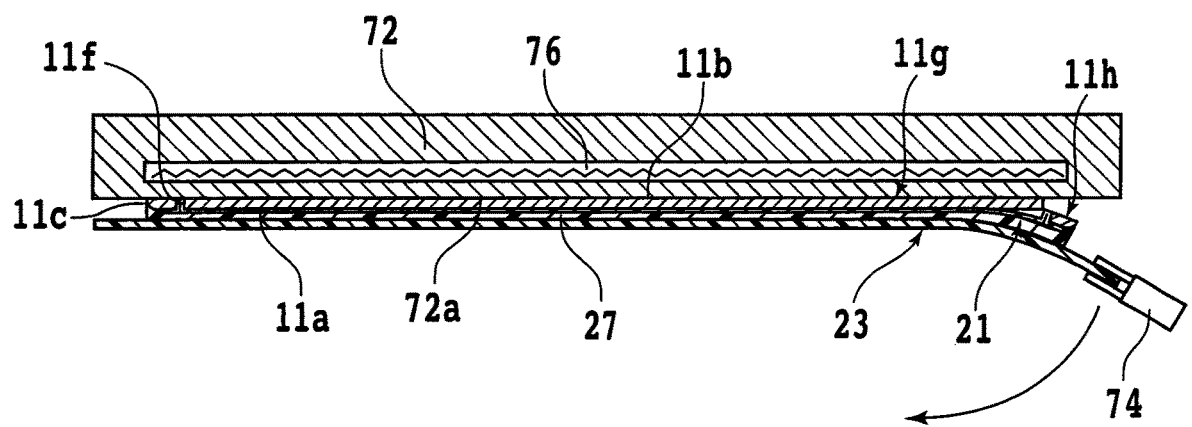
FIG. 10 is a schematic sectional view showing a manner of peeling the protective film and the protective member from the wafer in a peeling step in the wafer processing method according to the third modification.
Figure 1:
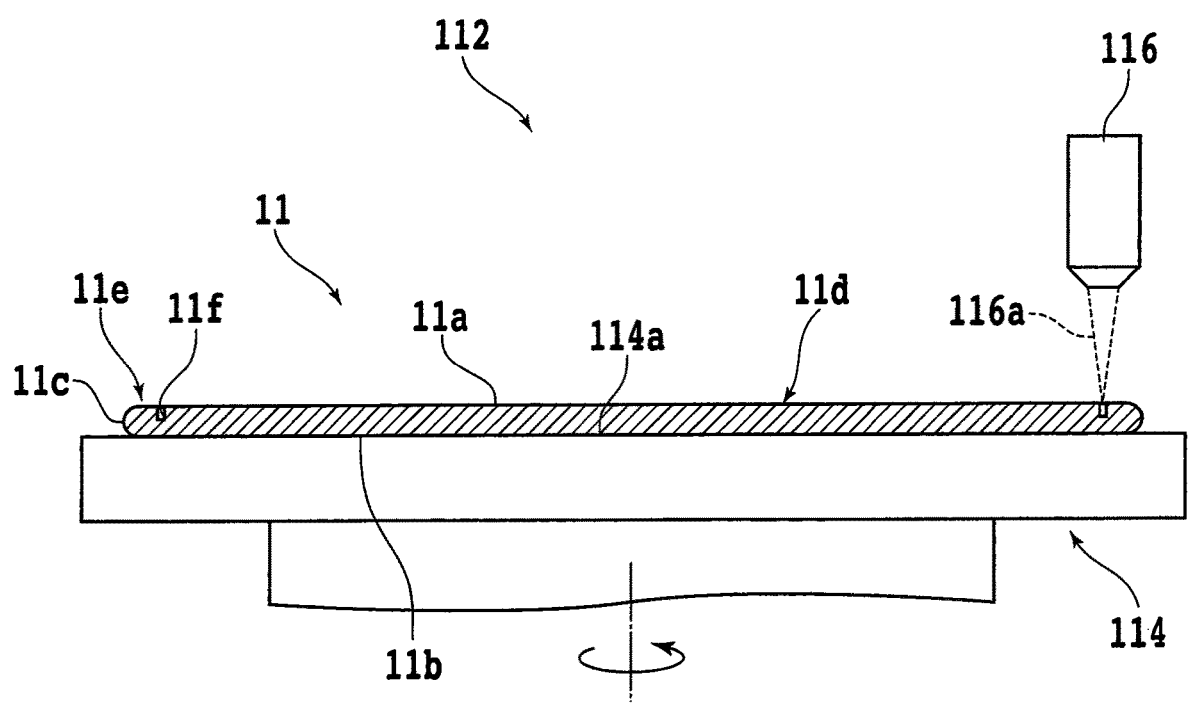

FIG. 10 is a schematic sectional side view showing a manner of peeling the protective film 21 and the protective member 27 from the wafer 11 in the peeling step in the wafer processing method according to the third modification. In the peeling step according to the third modification, the back side 11b of the wafer 11 is first held on a holding surface 72a of a wafer holding unit 72 as shown in FIG. 10. In this modification, a heater 76 is provided inside the wafer holding unit 72.

After holding the wafer 11 on the holding surface 72a of the wafer holding unit 72, a peeling unit 74 is used to grip a peripheral portion of the sheet 23. Thereafter, the wafer holding unit 72 and the peeling unit 74 are relatively moved so as to peel the protective film 21 away from the device area 11d of the circular portion 11g of the wafer 11. At this time, the heater 76 is preferably operated to heat the liquid 31 left between the protective film 21 and the circular portion 11g, thereby vaporizing the liquid 31. Accordingly, the annular portion 11h is moved away from the circular portion 11g, and all of the protective film 21, the protective member 27, and the sheet 23 can be peeled together from the circular portion 11g of the wafer 11 as shown in FIG. 10. The protective film 21, the protective member 27, and the sheet 23 peeled from the circular portion 11g are discarded together with the annular portion 11h. To facilitate the removal of the annular portion 11h from the wafer holding unit 72, the holding force (attraction) for the annular portion 11h by the wafer holding unit 72 may be previously set smaller than that for the circular portion 11g.

In the close contact making step according to the third modification, the protective film 21 is pressed against the front side 11a of the wafer 11 in a radially outward direction starting from the center of the wafer 11. Accordingly, it is possible to prevent the possibility that a gas (air) may be left between the wafer 11 and the protective film 21, thereby reliably bringing the protective film 21 into close contact with the front side 11a of the wafer 11. As a result, although the protective film 21 does not have adhesion by an adhesive (paste), there is no possibility that the protective film 21 and the protective member 27 may be peeled from the wafer 11 in grinding the wafer 11.

Further, in the close contact making step according to the third modification, the liquid 31 is moved to push out a gas (air) in pressing the protective film 21 against the front side 11a of the wafer 11. Accordingly, the gas is prevented from being left between the wafer 11 and the protective film 21, thereby more reliably bringing the protective film 21 into close contact with the front side 11a of the wafer 11. Further, in the peeling step according to the third modification, a film of the liquid 31 left between the protective film 21 and the wafer 11 is vaporized by heating, so that the protective film 21 can be peeled more easily.

The wafer holding unit 72 and the peeling unit 74 shown in FIG. 10 may be located in a vacuum chamber. In this case, the peeling step can be performed under vacuum, so that the boiling point of the liquid 31 can be lowered to thereby facilitate the vaporization of the liquid 31.

FIG. 11 is a schematic sectional side view showing a manner of forming an annular groove 11f on the front side 11a of the wafer 11 in an annular groove forming step in a wafer processing method according to a fourth modification. The other steps in the wafer processing method according to the fourth modification may be the same as those in the wafer processing method according to the above preferred embodiment. The annular groove forming step according to the fourth modification may be performed by using a laser processing apparatus 112 shown in FIG. 11. The laser processing apparatus 112 includes a chuck table (holding table) 114 for holding the wafer 11 under suction. The chuck table 114 is connected to a rotational drive source (not shown) such as a motor. Accordingly, the chuck table 114 is adapted to be rotated about its axis substantially parallel to a vertical direction, by operating this rotational drive source. Further, a horizontally moving mechanism (not shown) is provided below the chuck table 114, so as to move the chuck table 114 in a feeding direction (first horizontal direction) and in an indexing direction (second horizontal direction) perpendicular to the feeding direction in a horizontal plane.

The chuck table 114 has an upper surface, a part of which is formed as a holding surface 114a for holding the back side 11b of the wafer 11 under suction. The holding surface 114a is connected through a suction passage (not shown) to a vacuum source (not shown), and the suction passage is formed inside the chuck table 114. Accordingly, by applying a vacuum generated from the vacuum source through the suction passage to the holding surface 114a in the condition where the back side 11b of the wafer 11 is in contact with the holding surface 114a, the wafer 11 can be held on the chuck table 114 under suction. As a modification, the chuck table 114 may be replaced by another type of chuck table capable of holding the wafer 11 by using a mechanical method or an electrical method. A laser applying unit 116 is provided above the chuck table 114, so as to apply a laser beam 116a to the wafer 11 held on the chuck table 114, and the laser beam 116a is a pulsed laser beam having an absorption wavelength to the wafer 11 (i.e., a wavelength easy to absorb in the wafer 11).

In the annular groove forming step according to the fourth modification, the wafer 11 is first placed on the chuck table 114 in the condition where the back side 11b of the wafer 11 is in contact with the holding surface 114a of the chuck table 114. At this time, the center of the wafer 11 is made to substantially coincide with the rotation axis of the chuck table 114 as viewed in plan. Thereafter, a vacuum generated from the vacuum source is applied to the wafer 11 placed on the holding surface 114a of the chuck table 114. Accordingly, the wafer 11 is held on the chuck table 114 under suction in the condition where the front side 11a of the wafer 11 is exposed upward.

Thereafter, the laser beam 116a is applied from the laser applying unit 116 to the front side 11a of the wafer 11 along the inner circumference of the peripheral marginal area 11e. More specifically, as shown in FIG. 11, the laser beam 116a is applied to the inner circumference of the peripheral marginal area 11e formed on the front side 11a of the wafer 11, and at the same time the chuck table 114 is rotated. The laser processing conditions by the laser beam 116a are adjusted so as to form an annular groove 11f having a depth greater than the finished thickness of the wafer 11. As a result, the annular groove 11f having a depth greater than the finished thickness of the wafer 11 can be formed on the front side 11a of the wafer 11 along the inner circumference of the peripheral marginal area 11e.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a central device area and a peripheral marginal area surrounding said device area on the front side, a plurality of devices each having asperities being formed in said device area, said wafer processing method comprising:
   an annular groove forming step of forming an annular groove on the front side of said wafer along the inner circumference of said peripheral marginal area, said annular groove having a depth greater than a finished thickness of said wafer;
   a close contact making step of covering said device area and said annular groove on the front side of said wafer with a protective film after performing said annular groove forming step, and next bringing said protective film into close contact with the front side of said wafer so as to follow said asperities of each device formed on the front side of said wafer;
   a protective member fixing step of covering said protective film and an exposed part of said peripheral marginal area with a protective member formed from a liquid resin curable by external stimulus after performing said close contact making step, thereby fixing said protective member through said protective film to the front side of said wafer;
   a grinding step of holding said protective member fixed to said wafer on a holding surface of a chuck table in the condition where the back side of said wafer ie exposed after performing said protective member fixing step, and next grinding the back side of said wafer to thereby reduce the thickness of said wafer to the finished thickness of said wafer, so that the bottom of said annular groove is exposed to the back side of said wafer, thereby separating said wafer along said annular groove into an annular portion including said peripheral marginal area and a circular portion including said device area in the condition where said protective member is fixed to said wafer; and
   a peeling step of peeling said protective member and said protective film from said device area of said circular portion and removing said protective member and said protective film together with said annular portion.

2. The wafer processing method according to claim 1, wherein said close contact making step includes the step of forcing said protective film into said annular groove to thereby bring said protective film into close contact with the inside surface of said annular groove.

3. The wafer processing method according to claim 1, wherein said annular groove forming step includes the step of cutting the front side of said wafer along the inner circumference of said peripheral marginal area by using a cutting blade, thereby forming said annular groove.

4. The wafer processing method according to claim 1, wherein said annular groove forming step includes the step of applying a laser beam to the front side of said wafer along the inner circumference of said peripheral marginal area, said laser beam having an absorption wavelength to said wafer, thereby forming said annular groove.

5. The wafer processing method according to claim 1, wherein the outer circumference of said wafer is chamfered on the front side of said wafer;
   said protective member fixing step including the step of fully covering the front side of said wafer with said protective member in such a manner that a chamfered portion of the outer circumference of said wafer is also covered with said protective member.

6. The wafer processing method according to claim 1, wherein said protective member fixing step includes the steps of applying said liquid resin to a flat sheet, next pressing said wafer against said liquid resin through said protective film to thereby fully cover said protective film with said liquid resin, and next applying said external stimulus to said liquid resin to thereby cure said liquid resin, thereby forming said protective member from said liquid resin and fixing said protective member to said wafer.

7. The wafer processing method according to claim 1, wherein said close contact making step includes the steps of pressing said protective film against the front side of said wafer under vacuum and next applying atmospheric pressure to said protective film to thereby bring said protective film into close contact with the front side of said wafer so as to follow said asperities.

8. The wafer processing method according to claim 1, wherein said close contact making step includes the steps of opposing said protective film to the front side of said wafer and next pressing said protective film against the front side of said wafer in a radially outward direction starting from the center of said wafer to thereby bring said protective film into close contact with the front side of said wafer so as to follow said asperities.

9. The wafer processing method according to claim 1, wherein said close contact making step includes the steps of supplying a liquid to the front side of said wafer and next pressing said protective film against the front side of said wafer with said liquid interposed therebetween.

10. The wafer processing method according to claim 9, wherein said peeling step includes the step of heating said liquid left between said protective film and the front side of said wafer to thereby vaporize said liquid.

\* \* \* \* \*